United States Patent
Murata et al.

(10) Patent No.: US 6,931,040 B2
(45) Date of Patent: Aug. 16, 2005

(54) SYSTEM AND METHOD FOR USING AN OUTPUT TRANSFORMER FOR LASER DIODE DRIVERS

(75) Inventors: Kazuhiko Murata, Ageo (JP); Tatsuya Kouketsu, Akishima (JP); Yoshihiko Hayashi, Tokyo (JP)

(73) Assignee: Maxim Integrated Products, Inc., Sunnyvale, CA (US)

( * ) Notice: Subject to any disclaimer, the term of this patent is extended or adjusted under 35 U.S.C. 154(b) by 163 days.

(21) Appl. No.: 10/600,504

(22) Filed: Jun. 20, 2003

(65) Prior Publication Data

US 2004/0258114 A1 Dec. 23, 2004

(51) Int. Cl.[7] .............................. H01S 3/00; H01S 3/13
(52) U.S. Cl. ................................ 372/38.02; 372/38.08
(58) Field of Search ........................... 372/38.02, 38.08

(56) References Cited

U.S. PATENT DOCUMENTS

| | | | | |
|---|---|---|---|---|
| 3,967,159 A | * | 6/1976 | Dendy et al. ............... | 315/247 |
| 4,995,044 A | * | 2/1991 | Blazo ......................... | 372/25 |
| 5,134,428 A | * | 7/1992 | Kline et al. ................. | 347/162 |
| 5,883,910 A | | 3/1999 | Link | |
| 6,292,501 B1 | * | 9/2001 | DuBose ..................... | 372/38.04 |
| 6,711,190 B2 | * | 3/2004 | Schemmann et al. ..... | 372/38.02 |

OTHER PUBLICATIONS

"10.7Gbps EAM Driver", printed date sheet 19–4803, Maxim Integrated Products, Rev 0; Apr. 2001; pp. 1–12.
"3.0V to 5.5V, 1.25Gbps/2.5 Gbps LAN Laser Drivers", printed data sheet 19–1550, Maxim Integrated Products , Rev 2; Mar. 2001, pp. 1–27.
"Simulating Direct Laser Modulation with the MAX3930", Design Note: HFDN–4.0, Maxim Integrated Products, Rev 0; Dec. 2000, pp. 1–3.
"Interfacing Maxim Laser Drivers with Laser Diodes", Application Note: HFAN–2.0, Maxim Integrated Products, Rev 0, May 2000, pp. 1–12.
"Parasitic Inductance Effects in the Design of 10Gbps Optical Transmitters", Application Note: HFAN–2.0.1, Maxim Integrated Products, Rev 0, Feb. 2002, pp. 1–3.
"10.7Gbps Laser Diode Drivers", printed data sheet 19–1856, Maxim Integrated Products, Rev 3, Mar. 2002, pp. 1–14.

* cited by examiner

Primary Examiner—James Vannucci
(74) Attorney, Agent, or Firm—Jenkens & Gilchrist

(57) ABSTRACT

A laser diode driver output stage for driving an associated laser diode device. The laser diode driver output stage includes a driver circuit adapted to receive an input data signal at an input node and provide an output signal to a positive output node and a negative output node in response to the data signal. The laser diode driver output stage further includes a transformer having a positive terminal of a first side coupled to the positive output node of the driver circuit, a negative terminal of the first side coupled to the negative output node, a positive terminal of a second side coupled to the positive output node, and negative terminal of the second side coupled to a bias current generator. The transformer functions to isolate the bias current from fluctuations in the output signal, whereby the output signal and bias current are provided to the associated laser diode device.

41 Claims, 3 Drawing Sheets

SYSTEM AND METHOD FOR USING AN OUTPUT TRANSFORMER FOR LASER DIODE DRIVERS

TECHNICAL FIELD OF THE INVENTION

The present invention relates to an improved laser diode driver integrated circuit, and in particular to a laser diode driver integrated circuit having an improved output stage.

BACKGROUND OF THE INVENTION

A majority of laser diode driver integrated circuits (ICs) for optical transmission can be broadly divided into two categories. The first category includes devices using direct modulation. This is generally used for short distance transmission in which a laser diode driver IC is used to directly drive a laser diode module with a drive current supplied by the laser diode driver IC. The second category includes devices which generally use external modulation. These are commonly used for long-distance transmission in which, for example, an electroabsorption (EA) modulator driver IC is used to drive an electroabsorption (EA) modulator module. In both of these categories, laser diode driver ICs can be found in both die forms in which the IC is assembled inside the laser module, and in packaged forms in which the IC is assembled outside of the laser module and connected by a transmission line.

Due to the need for ever increasing data transmission rates, the use of conventional laser diode driver integrated circuits results in numerous signal quality problems. In addition, convention laser diode driver integrated circuits consume a high amount of power due to the need for high supply voltages. Thus there is a need for laser diode driver integrated circuits that provide improved output signal quality as well as lower power consumption.

SUMMARY OF THE INVENTION

One embodiment of the present invention is directed to a laser diode driver output stage for driving an associated laser diode device. The laser diode driver output stage includes a driver circuit having at least one input node, a positive output node, and a negative output node. The driver circuit is adapted to receive an input data signal at the at least one input node and provide an output signal to at least one of the positive output node and the negative output node in response to the data signal. The laser diode driver output stage further includes a transformer having a positive terminal of a first side coupled to the positive output node of the driver circuit, a negative terminal of the first side coupled to the negative output node, and a positive terminal of a second side coupled to the positive output node. The laser diode driver output stage further includes a bias current generator coupled to a negative terminal of the second side of the transformer, the bias current generator providing a bias current to the negative terminal of the second side, and the transformer adapted to isolate the bias current from fluctuations in the output signal, whereby the output signal and bias current are provided to the associated laser diode device.

Another embodiment of the present invention is directed to a method of providing an improved drive signal from a laser diode driver output stage to a laser diode device, the method comprising the steps of receiving an input data signal at at least one input node of a driver circuit, providing an positive output signal from the driver circuit to a positive output node in response to the data signal, and providing a negative output signal from the driver circuit to a negative output node in response to the data signal. The method further includes the steps of receiving the positive output signal at a positive terminal of a first side of a transformer and a positive terminal of a second side of the transformer, receiving the negative output signal at a negative terminal of the first side of the transformer, and providing a bias current to a negative terminal of the second side of the transformer from a bias current generator. The method further includes the step of isolating the bias current from fluctuations in at least one of the positive output signal and the negative output signal, whereby the output signal and bias current are provided to the laser diode device.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE INVENTION

Figure 1:
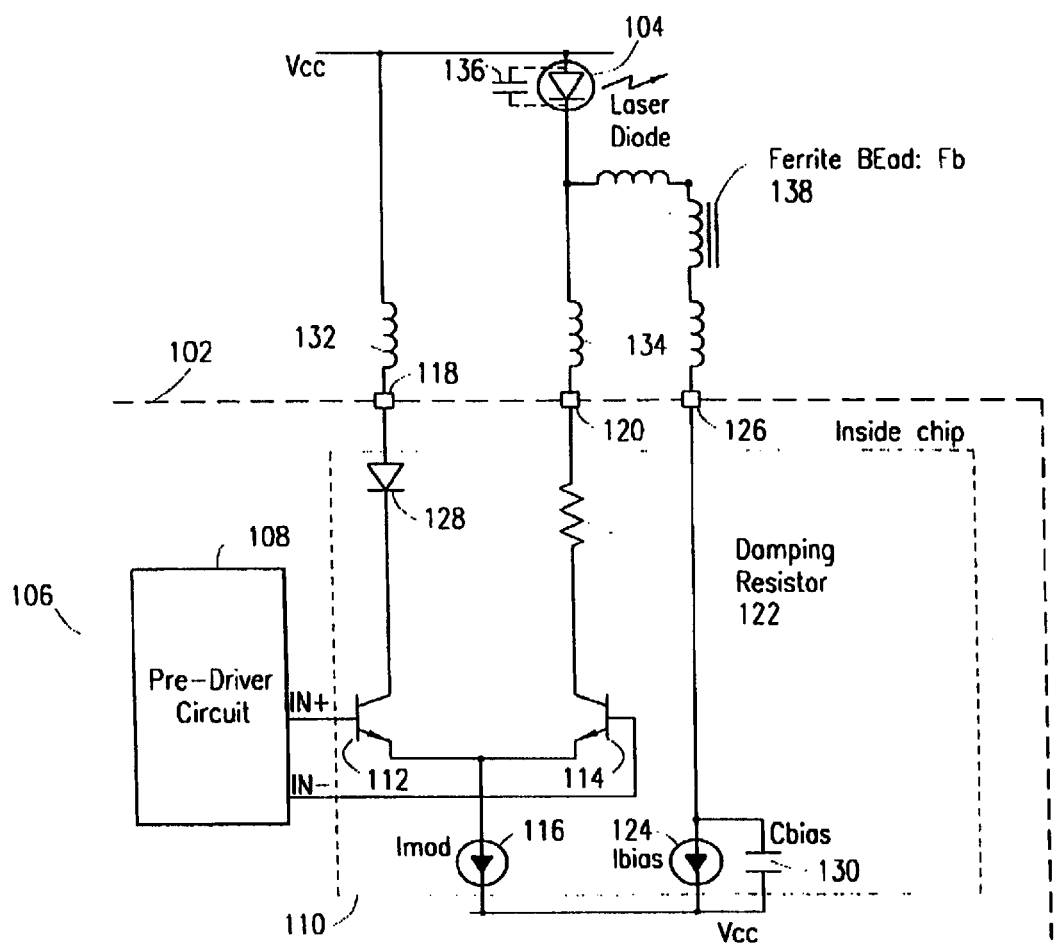
FIG. 1 illustrates an output stage of a conventional laser diode driver integrated circuit (IC) and an associated laser diode.

Reference is now made to the Drawings wherein like reference characters denote like or similar parts throughout the various Figures. Referring now to FIG. 1, an output stage of a conventional laser diode driver integrated circuit (IC) and associated laser diode is illustrated. The output of a conventional laser diode driver IC 102 is connected to a laser diode 104. The conventional laser diode driver IC 102 includes a conventional laser diode driver integrated circuit output stage 106 therein.

The conventional laser diode driver integrated circuit output stage 106 comprises a pre-driver circuit 108 and a conventional driver circuit 110. During operation, the pre-driver circuit 108 provides differential input data signals (IN+,IN−), representative of the data signal that is desired to be transmitted by the laser diode 104, to the conventional driver circuit 110. In response to the differential input data signals (IN+,IN−), the conventional driver circuit 110 provides a modulated output drive signal to the laser diode 104, which generates an optical output data signal that is representative of the differential input data signals (IN+,IN−).

The conventional driver circuit 110 of the conventional laser diode driver integrated circuit output stage 106 typically comprises an output switch architecture in the form of a bipolar junction transistor (BJT) differential pair configuration. The conventional driver circuit 110 of FIG. 1 includes a first transistor 112 and second transistor 114 whose respective emitter nodes are joined together and biased by a modulation current source 116 providing a modulation current (Imod), which is further connected to a low reference supply voltage (Vee). The collector node of the first transistor 112 is connected to a negative output terminal 118 of the conventional laser diode driver IC 102 through a dummy diode 128. The negative output terminal 118 is further connected to high reference supply voltage (Vcc) through a connection having a wire bond inductance 132. The collector node of the second transistor 114 is connected to a positive output terminal 120 through a damping resistor 122.

The conventional driver circuit 110 further includes a bias current source 124 for providing a bias current (Ibias) to a bias current output terminal 126. In addition, the bias current source 124 possesses a parasitic capacitance 130 that acts in parallel to the bias current source 124. The bias current source 124 is further connected to the low reference supply voltage (Vee). The function of the bias current (Ibias) is to push the laser diode 104 operating range beyond its threshold value and into the linear region of operation.

An anode of the laser diode 104 is connected to the high reference supply voltage (Vcc), while a cathode of the laser diode 104 is connected to the positive output terminal 120 through a connection having a wire bond inductance 134. In addition, the laser diode 104 inherently possesses a parasitic capacitance which is shown by a capacitor 136. This parasitic capacitance may be on the order of several picofarads (pF). The cathode of the laser diode 104 is normally further connected to the bias current output terminal 126 through a ferrite bead 138 functioning as an isolator.

During operation, the aforementioned differential input data signals (IN+,IN−) are provided from the pre-driver circuit 108 to the respective gate nodes of the first transistor 112 and the second transistor 114. The modulation current source 116 provides the modulation current (Imod) that is modulated in proportion to the transmitted data signal, while the bias current source 124 provides the bias current (Ibias) to bias the laser diode 104 just prior to oscillation. In response to the differential input data signals (IN+,IN−), the differential pair configuration provides the modulated output drive signal to the negative output terminal 118 and the positive output terminal 120 for driving the laser diode 104.

In order to drive a laser diode 104 to transmit data at higher rates, for example, a rate of 10 Gbits/sec or greater, a modulation current of 60 mA, and a bias current of 60 mA is typically necessary. In addition, it is necessary for the output current falling time/rising time (tr/tf) transition to be at as high a rate as possible, typically on the order of 20–30 picoseconds (ps).

In order to handle the high current requirements and the high speed pulse requirements, the conventional laser diode driver IC 102 is usually packaged inside a laser module driver in a die form, and wire bonded onto the laser diode 104. When packaged in this form and with the aforementioned drive requirements, the wire bond inductance 132, 134 and parasitic capacitance 136 of the laser diode 104, causes ringing on the output current waveform with a frequency approximately equal to the bit rate of data transmission. As a consequence of this ringing, a large amount of overshoot/undershoot, small eye opening of the eye diagram, and an increase in deterministic jitter is present.

The aforementioned damping resistor 122, typically having a value of several ohms to several tens of ohms, functions to suppress such ringing. However, the damping resistor 122 causes degradation of the rising time/falling time (tr/tf) of the output current waveform, as well as a shortage of headroom of the second transistor 114 when used at low supply voltages. The ferrite bead 138, placed between the positive output terminal 120 and the bias current output terminal 126, acts as an isolator between fluctuations in the modulation current and the bias current. Without the ferrite bead 138, the parasitic capacitance 130 of the bias current source 124 will fluctuate due to the ringing generated in the modulation current waveform as a result of wire bond inductances. The fluctuation in the parasitic capacitance 130 results in fluctuations in the bias current (Ibias), which causes further degradation of the output current waveform.

The conventional laser diode driver integrated circuit output stage 106 of FIG. 1 possesses several disadvantages. At high data transfer rates, such as at bit rates greater than 10 Gbits/sec, the parasitic capacitance and inductance of ferrite bead 138 impacts the optical characteristics of the laser diode 104. In addition, it is desirable from a packaging standpoint to have both the output switch stage and bias current source 124 inside the integrated circuit package.

When the power supply voltage is at a high level, e.g. greater than 5 volts, the output switch stage and bias current source 124 can be isolated by cascading the bias current source 124. However, with a low power supply voltage, e.g. 3.3 volts this is difficult to achieve, as it is difficult to meet both the requirement for a large drive current (more than 60 mA) and adequate collector-emitter voltage headroom when the bias current circuit is configured with bipolar transistors.

Figure 2:
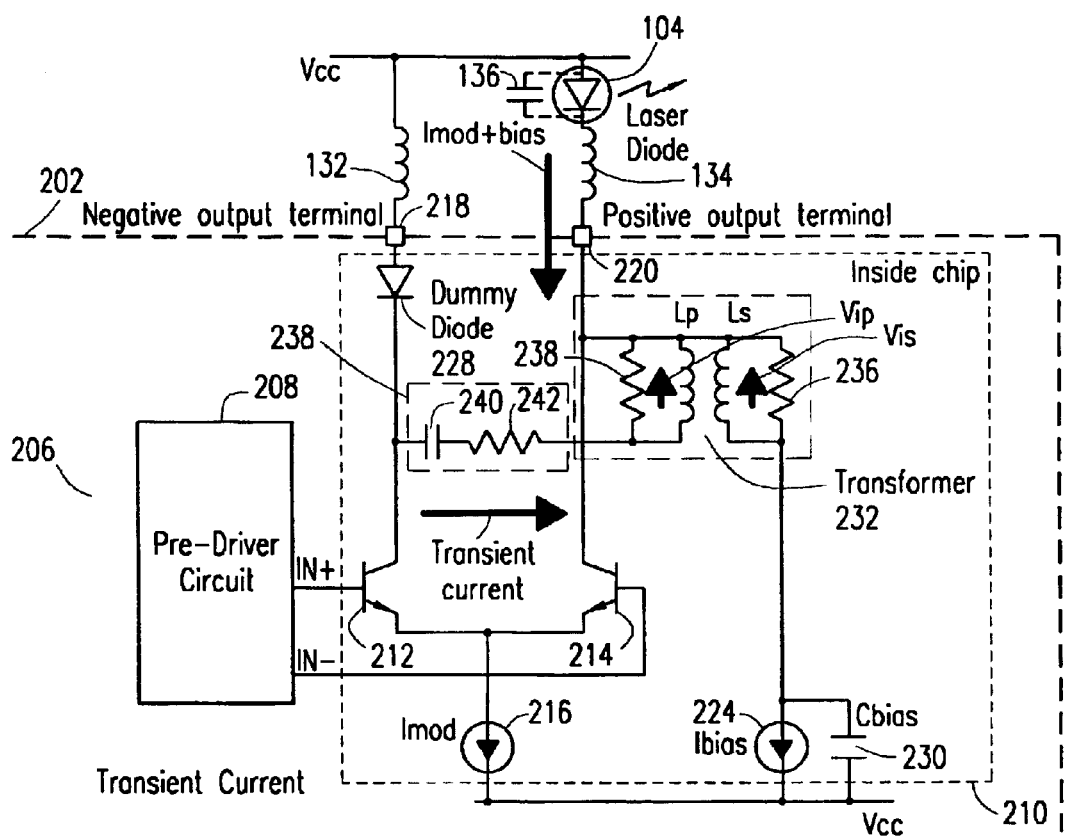
FIG. 2 illustrates an output stage of a laser diode driver integrated circuit (IC) in accordance with an embodiment of the present invention and an associated laser diode.

Referring now to FIG. 2, an output stage of a laser diode driver integrated circuit (IC) in accordance with an embodiment of the present invention and an associated laser diode is illustrated. The laser diode driver IC 202 is connected to a laser diode 104 for providing a modulated output drive signal. The laser diode driver IC 202 includes a laser diode driver integrated circuit (IC) output stage 206 that includes a pre-driver circuit 208 and a driver circuit 210 comprised of an output switch architecture. In the presently described embodiment, the driver circuit 210 of the laser diode driver integrated circuit output stage 206 comprises a bipolar conjunction transistor (BJT) differential pair configuration functioning as a differential amplifier.

The driver circuit 210 of FIG. 2 includes a first switch transistor 212 and a second switch transistor 214 whose respective emitter nodes are joined together and biased by a modulation current source 216 provided a modulation current (Imod). The modulation current source 216 is further connected to a low reference supply voltage (Vee). The collector node of the first switch transistor 212 is connected to a negative output terminal 218 of the laser diode driver IC 102 through a dummy diode 228. The negative output terminal 218 is further connected to high reference supply voltage (Vcc) through a connection. This connection will have an inherent wire bond inductance 132. The collector node of the second switch transistor 214 is connected to a positive output terminal 220.

The driver circuit 210 further includes a bias current source 224 for providing a bias current (Ibias) whose function is to push the laser diode 104 operating range beyond its threshold value and into the linear region of operation. The bias current source 224 possesses a parasitic capacitance 230 that acts in parallel to the bias current source 224.

In accordance with the present invention, a transformer 232 is connected within the integrated circuit output stage 206. It should be understood that the transformer 232 may be comprised of an on-chip transformer fabricated on the die of the laser diode driver integrated circuit output stage 206. Alternately, the transformer 232 may be comprised of any other suitable transformer either external to or internal to the integrated circuit package.

Still referring to FIG. 2, a negative terminal of a primary side (Lp) of the transformer 232 is connected to the collector node of the first switch transistor 212 through an RC network 238, and a positive terminal of the primary side (Lp) of the transformer 232 is connected to the collector node of the second switch transistor 214. In the present embodiment, the RC network 238 is comprised of a capacitor 240 and resistor 242 connected in series, although it should be understood that any suitable RC network can be used. A positive terminal of a secondary side (Ls) of the transformer 232 is connected to the collector node of the second switch transistor 214, and a negative terminal of the secondary side (Ls) of the transformer 232 is connected to the bias current source 224. The bias current source 224 is further connected to the low reference supply voltage (Vee).

Further, a primary side resistor 234 is connected in parallel between the positive and negative terminals of the primary side (Lp) of the transformer 232, and a secondary side resistor 236 is connected in parallel between the positive and negative terminals of a secondary side (Ls) of the transformer 232.

The anode of the laser diode 104 is connected to the high reference supply voltage (Vcc), while the cathode of the laser diode 104 is connected to the positive output terminal 220 through a connection having a wire bond inductance 134. In addition, the laser diode 104 possesses a parasitic capacitance 136 of several picofarads (pF).

During operation, differential input data signals (IN+, IN−) are provided from the pre-driver circuit 208 to the respective gate nodes of the first switch transistor 212 and the second switch transistor 214. The modulation current source 216 provides the modulation current (Imod) that is modulated in proportion to the transmitted data signal, while the bias current source 224 provides a bias current (Ibias) to bias the laser diode 104. In response to the differential input data signals (IN+,IN−), the differential pair configuration provides a modulated output drive signal to the negative output terminal 218 and the positive output terminal 220 for driving the laser diode 104.

During the driving of the laser diode 104, an output current, comprised of the modulation current and bias current (Imod+Ibias), is output from the positive output terminal 220. Due to the parasitic capacitance 136 of the laser diode 104 and the wire bond inductance 134 at the positive output terminal 220, ringing occurs at the edges of the output current waveform.

The use of the transformer 232 and RC network 238 between the positive and negative sides of the output switch in accordance with the principles of the present invention produces a transient current flow in the opposite direction of the ringing of the output current waveform. This results in a decrease in the rising times/falling times (tr/tf) of the output current waveform transitions. In addition, the tr/tf transition edge of the transient current generates an electromotive force (Vip) on the primary side of the transformer 232, resulting in a suppression of the ringing in the output current waveform. It should be understood, that the characteristics of the transient current can be adjusted by an appropriate choice of the network time constant of the RC network 238, which enables adjustment of the overshoot/undershoot caused by the output current tr/tf and ringing.

The transformer 232 and RC network 238 of the present invention also provides for improved isolation of the bias current from output current waveform fluctuations. When current is fed to the laser diode 104, transient current flowing through the RC network 238 results in the edge of the rising time/falling time (tr/tf) waveform transitions generating an electromotive force Vip on the primary side (Lp) of the transformer 232. As a result of the electromotive force Vip, a corresponding electromotive force Vis is generated at the secondary side (Ls) of the transformer 232 connected to the bias current source 224 in proportion to the coupling factor K of the transformer 232. The resultant electromotive force Vis is generated in the inverse direction as that of the abrupt transition of the waveform at the positive output terminal 220. As a result of the generation of the electromotive force Vip, fluctuation of the parasitic capacitance 230 of the bias current source 224 caused by the output current waveform is suppressed.

The secondary side resistor 236, placed in series with the secondary side of the transformer 232 and the bias current source 224, functions as a damping resistor to suppress ringing generated by the parasitic capacitance 230 of the bias current source 224 and the inductance of the secondary side (Ls) of the transformer 232.

It should be understood that numerous modifications may be made to the embodiment of FIG. 2 without departing from the spirit of the present invention. Although the invention of FIG. 2 is illustrated using a bipolar junction transistor (BJT) pair architecture as a driver circuit, any other suitable output switch architecture may be used, such as those using field effect transistors (FETs), CMOS devices, etc. In addition, although the driver circuit of FIG. 2 is illustrated through the use of a single stage emitter-coupled differential amplifier, a multi-stage differential amplifier having a transformer in its output stage may be used without departing from the spirit of the invention. The principles of the present invention are also applicable to output stages having both single-ended and differential outputs and/or inputs.

Although the embodiment of FIG. 2 illustrates the use of a laser diode driver IC to drive a laser diode, the principles of the present invention are equally applicable to an electroabsorption (EA) modulator driver IC used to drive an electroabsorption (EA) modulator module for long distance transmission. Additionally, the principles of the present invention are applicable to any driver device used to drive a load.

Figure 3:
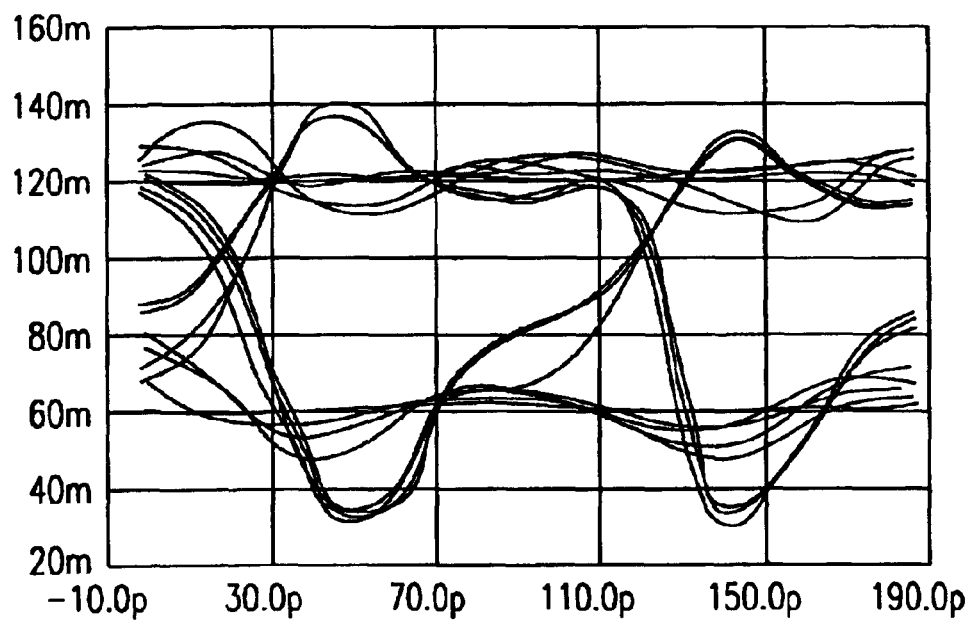
FIG. 3 illustrates an output current eye diagram of a conventional laser diode driver integrated circuit.
Figure 4:
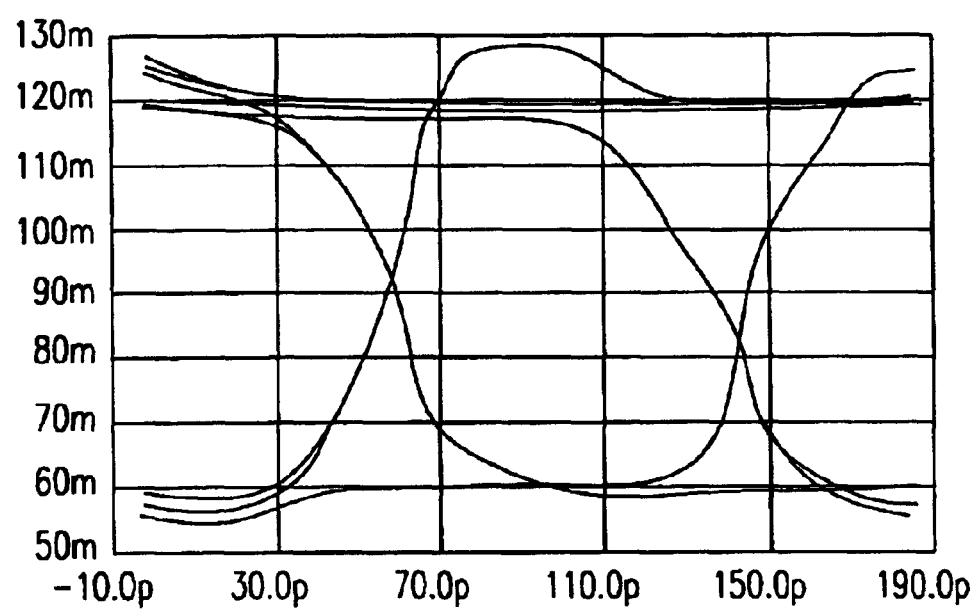
FIG. 4 illustrates an output current eye diagram of laser diode driver integrated circuit having a transformer and an RC network in the output stage in accordance with the principles of the present invention.

Referring now to FIG. 3, an output current eye diagram of a conventional laser diode driver integrated circuit is illustrated. As illustrated in FIG. 3, a large amount of ringing and current fluctuation is present in the output current signal. FIG. 4 illustrates an output current eye diagram of laser diode driver integrated circuit having a transformer and an RC network in the output stage in accordance with the principles of the present invention. As can be seen in FIG. 4, ringing and current fluctuation in the output current signal has been greatly reduced.

The improved laser diode driver integrated circuit output stage of the present invention provides several benefits over conventional laser diode driver integrated circuits. The laser diode driver IC of the present invention allows for a lower supply voltage (e.g. Vcc=3.3V typical) over that of a conventional laser diode driver IC, resulting in lower power consumption. In addition, output current ringing caused by parasitic capacitance of the laser diode and the wire bond inductance of the output pad can be greatly reduced without resulting in an increase in the rising times and the falling times of the output waveform transitions. Additionally, a reduction in the deterministic jitter and eye opening in the eye diagram of the output current is achieved.

The present invention provides for the further benefit of reducing the impact of the output current switch stage generating the modulation current upon the bias current source generating the bias current, even when the output switch stage and the bias current source are connected within the integrated circuit.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. A laser diode driver output stage for driving an associated laser diode device, the laser diode driver output stage comprising:
   a driver circuit having at least one input node, a positive output node, and a negative output node, the driver circuit adapted to receive an input data signal at the at least one input node and provide an output signal to at least one of the positive output node and the negative output node in response to the data signal;
   a transformer having a positive terminal of a first side coupled to the positive output node of the driver circuit, a negative terminal of the first side coupled to the negative output node, and a positive terminal of a second side coupled to the positive output node;
   an RC network coupled between the negative output node of the driver circuit and the negative terminal of the first side of the transformer, the RC network adapted to suppress ringing of the output signal from the positive output node; and
   a bias current generator coupled to a negative terminal of the second side of the transformer, the bias current generator adapted to provide a bias current to the negative terminal of the second side, the transformer adapted to isolate the bias current from fluctuations in the output signal, whereby the output signal and bias current are provided to the associated laser diode device.

2. The laser diode driver output stage of claim 1, wherein the first side of the transformer comprises a primary side, and the second side of the transformer comprises a secondary side.

3. The laser diode driver output stage of claim 1, wherein the ringing of the output signal is caused by at least one of a parasitic capacitance of the laser diode device and a wire bond inductance at the positive output node of the driver circuit.

4. The laser diode driver output stage of claim 1, further comprising:
   a first side resistor coupled in parallel between the positive terminal of the first side of the transformer and the negative terminal of the first side of the transformer.

5. The laser diode driver output stage of claim 1, further comprising:
   a second side resistor coupled in parallel between the positive terminal of the second side of the transformer and the negative terminal of the second side of the transformer, the second side resistor adapted to suppress ringing generated by at least one of a parasitic capacitance of the bias current generator and an inductance of the second side of the transformer.

6. The laser diode driver output stage of claim 1, wherein the driver circuit comprises an output switch architecture.

7. The laser diode driver output stage of claim 1, wherein the driver circuit comprises a differential amplifier.

8. The laser diode driver output stage of claim 1, wherein the driver circuit comprises:
   a first switch transistor adapted to receive a first differential input data signal of the input data signal at a first gate node; and
   a second switch transistor adapted to receive a second differential input data signal of the input data signal at a second gate node,
   wherein a first emitter node of the first switch transistor is coupled to a second emitter node of the second switch transistor, a first collector node of the first switch transistor is coupled the negative output node, and a second collector node of the second switch transistor is adapted to provide the output signal to the positive output node.

9. The laser diode driver output stage of claim 8, further comprising a modulation current generator coupled to the first emitter node and the second emitter node.

10. The laser diode driver output stage of claim 1, further comprising a pre-driver circuit adapted to provide the input data signal to the driver circuit.

11. A laser diode driver output stage for driving an associated laser diode device, the laser diode driver output stage comprising:
    a driver circuit having at least one input node, a positive output node, and a negative output node, the driver circuit adapted to receive an input data signal at the at least one input node and provide an output signal to at least one of the positive output node and the negative output node in response to the data signal;
    a transformer having a positive terminal of a first side coupled to the positive output node of the driver circuit, a negative terminal of the first side coupled to the negative output node, and a positive terminal of a second side coupled to the positive output node; and
    a bias current generator coupled to a negative terminal of the second side of the transformer, the bias current generator providing a bias current to the negative terminal of the second side, the transformer adapted to isolate the bias current from fluctuations in the output signal, whereby the output signal and bias current are provided to the associated laser diode device.

12. The laser diode driver output stage of claim 11, wherein the first side of the transformer comprises a primary side, and the second side of the transformer comprises a secondary side.

13. The laser diode driver output stage of claim 11, further comprising:
    an RC network coupled between the negative output node of the driver circuit and the negative terminal of the first side of the transformer, the RC network adapted to suppress ringing of the output signal from the positive output node.

14. The laser diode driver output stage of claim 13, wherein the ringing of the output signal is caused by at least one of a parasitic capacitance of the laser diode device and a wire bond inductance at the positive output node of the driver circuit.

15. The laser diode driver output stage of claim 11, further comprising:
    a first side resistor coupled in parallel between the positive terminal of the first side of the transformer and the negative terminal of the first side of the transformer.

16. The laser diode driver output stage of claim 11, further comprising:
    a second side resistor coupled in parallel between the positive terminal of the second side of the transformer and the negative terminal of the second side of the transformer, the second side resistor adapted to suppress ringing generated by at least one of a parasitic capacitance of the bias current generator and an inductance of the second side of the transformer.

17. The laser diode driver output stage of claim 11, wherein the driver circuit comprises an output switch architecture.

18. The laser diode driver output stage of claim 11, wherein the driver circuit comprises a differential amplifier.

19. The laser diode driver output stage of claim 11, wherein the driver circuit comprises:
   a first switch transistor adapted to receive a first differential input data signal of the input data signal at a first gate node; and
   a second switch transistor adapted to receive a second differential input data signal of the input data signal at a second gate node,
   wherein a first emitter node of the first switch transistor is coupled to a second emitter node of the second switch transistor, a first collector node of the first switch transistor is coupled the negative output node, and a second collector node of the second switch transistor is adapted to provide the output signal to the positive output node.

20. The laser diode driver output stage of claim 19, wherein the first switch transistor comprises a first bipolar junction transistor, and the second switch transistor comprises a second bipolar junction transistor.

21. The laser diode driver output stage of claim 19, further comprising a modulation current generator coupled to the first emitter node and the second emitter node.

22. The laser diode driver output stage of claim 11, further comprising a pre-driver circuit adapted to provide the input data signal to the driver circuit.

23. A method of providing an improved drive signal from a laser diode driver output stage to a laser diode device, the method comprising the steps of:
   receiving an input data signal at at least one input node of a driver circuit;
   providing an positive output signal from the driver circuit to a positive output node in response to the data signal;
   providing a negative output signal from the driver circuit to a negative output node in response to the data signal;
   receiving the positive output signal at a positive terminal of a first side of a transformer and a positive terminal of a second side of the transformer;
   receiving the negative output signal at a negative terminal of the first side of the transformer;
   providing a bias current to a negative terminal of the second side of the transformer from a bias current generator; and
   isolating the bias current from fluctuations in at least one of the positive output signal and the negative output signal, whereby the output signal and bias current are provided to the laser diode device.

24. The method of claim 23, wherein the first side of the transformer comprises a primary side, and the second side of the transformer comprises a secondary side.

25. The method of claim 23, further comprising the step of:
   suppressing ringing of the positive output signal from the positive output node using an RC network coupled between the negative output node of the driver circuit and the negative terminal of the first side of the transformer.

26. The method of claim 25, wherein the ringing of the positive output signal is caused by at least one of a parasitic capacitance of the laser diode device and a wire bond inductance at the positive output node of the driver circuit.

27. The method of claim 23, further comprising the step of:
   suppressing ringing generated by at least one of a parasitic capacitance of the bias current generator and an inductance of the second side of the transformer by coupling a side resistor in parallel between the positive terminal of the second side of the transformer and the negative terminal of the second side of the transformer.

28. A driver output stage for driving an associated device, the driver output stage comprising:
   a driver circuit having at least one input node, a positive output node, and a negative output node, the driver circuit adapted to receive an input data signal at the at least one input node and provide an output signal to at least one of the positive output node and the negative output node in response to the data signal;
   a transformer having a positive terminal of a first side coupled to the positive output node of the driver circuit, a negative terminal of the first side coupled to the negative output node, and a positive terminal of a second side coupled to the positive output node; and
   a bias current generator coupled to a negative terminal of the second side of the transformer, the bias current generator providing a bias current to the negative terminal of the second side, the transformer adapted to isolate the bias current from fluctuations in the output signal, whereby the output signal and bias current are provided to the associated device.

29. The driver output stage of claim 28, wherein the first side of the transformer comprises a primary side, and the second side of the transformer comprises a secondary side.

30. The driver output stage of claim 28, further comprising:
   an RC network coupled between the negative output node of the driver circuit and the negative terminal of the first side of the transformer, the RC network adapted to suppress ringing of the output signal from the positive output node.

31. The driver output stage of claim 30, wherein the ringing of the output signal is caused by at least one of a parasitic capacitance of the associated device and a wire bond inductance at the positive output node of the driver circuit.

32. The driver output stage of claim 28, further comprising:
   a first side resistor coupled in parallel between the positive terminal of the first side of the transformer and the negative terminal of the first side of the transformer.

33. The driver output stage of claim 28, further comprising:
   a second side resistor coupled in parallel between the positive terminal of the second side of the transformer and the negative terminal of the second side of the transformer, the second side resistor adapted to suppress ringing generated by at least one of a parasitic capacitance of the bias current generator and an inductance of the second side of the transformer.

34. The driver output stage of claim 28, wherein the driver circuit comprises an output switch architecture.

35. The driver output stage of claim 28, wherein the driver circuit comprises a differential amplifier.

36. The driver output stage of claim 28, wherein the driver circuit comprises:

a first switch transistor adapted to receive a first differential input data signal of the input data signal at a first gate node; and a second switch transistor adapted to receive a second differential input data signal of the input data signal at a second gate node, wherein a first emitter node of the first switch transistor is coupled to a second emitter node of the second switch transistor, a first collector node of the first switch transistor is coupled the negative output node, and a second collector node of the second switch transistor is adapted to provide the output signal to the positive output node.

37. The driver output stage of claim 36, wherein the first switch transistor comprises a first bipolar junction transistor, and the second switch transistor comprises a second bipolar junction transistor.

38. The driver output stage of claim 36, further comprising a modulation current generator coupled to the first emitter node and the second emitter node.

39. The driver output stage of claim 28, further comprising a pre-driver circuit adapted to provide the input data signal to the driver circuit.

40. The driver output stage of claim 28, wherein the driver output stage comprises a laser diode driver output stage.

41. The driver output stage of claim 28, wherein the driver output stage comprises an electroabsorption modulator driver output stage.

* * * * *